United States Patent
Qu et al.

(10) Patent No.: US 10,872,566 B2
(45) Date of Patent: Dec. 22, 2020

(54) OLED PIXEL CIRCUIT, DRIVING METHOD FOR THE OLED PIXEL CIRCUIT AND DISPLAY DEVICE

(71) Applicants: BOE TECHNOLOGY GROUP CO., LTD., Beijing (CN); Chengdu BOE Optoelectronics Technology Co., Ltd., Sichuan (CN)

(72) Inventors: Jiawei Qu, Beijing (CN); Wenjun Liao, Beijing (CN); Linxuan Li, Beijing (CN); Taoran Zhang, Beijing (CN); Qiao Feng, Beijing (CN); Da Zhou, Beijing (CN); Zailong Mo, Beijing (CN); Cailong Zhou, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 285 days.

(21) Appl. No.: 15/988,054

(22) Filed: May 24, 2018

(65) Prior Publication Data
US 2019/0180686 A1   Jun. 13, 2019

(30) Foreign Application Priority Data
Dec. 7, 2017   (CN) .......................... 2017 1 1285186

(51) Int. Cl.
G09G 3/3258   (2016.01)
G09G 3/3233   (2016.01)
(Continued)

(52) U.S. Cl.
CPC ......... *G09G 3/3258* (2013.01); *G09G 3/3233* (2013.01); *G09G 3/3291* (2013.01);
(Continued)

(58) Field of Classification Search
CPC .. G09G 3/3258; G09G 3/3233; G09G 3/3291; G09G 2300/0819;
(Continued)

(56) References Cited

U.S. PATENT DOCUMENTS

| 8,502,754 B2* | 8/2013 | Lin ......................... G09G 3/325 345/76 |
| 2007/0114530 A1* | 5/2007 | Kimura .................. H01L 27/124 257/59 |
| 2017/0270862 A1* | 9/2017 | Zhang .................. G09G 3/3233 |

* cited by examiner

Primary Examiner — Amr A Awad
Assistant Examiner — Maheen I Javed
(74) Attorney, Agent, or Firm — Calfee, Halter & Griswold LLP

(57) ABSTRACT

The present disclosure relates to an OLED pixel circuit, a method for driving the same and a display device. The OLED pixel circuit includes: a data writing and compensating circuit configured to make compensation to a threshold voltage of the first driver; the first driver configured to drive the light emitting device after the threshold voltage is compensated; the second driver configured to drive the light emitting device; the light emitting controller connected to the light emitting device and a second signal terminal, and configured to connect the first driver and the second driver to the light emitting device; and the light emitting device emitting light by joint driving of the first driver and the second driver.

13 Claims, 7 Drawing Sheets

(51) Int. Cl.
 *H01L 29/423* (2006.01)
 *G09G 3/3291* (2016.01)
(52) U.S. Cl.
 CPC .......... *H01L 29/42316* (2013.01); *G09G 2300/0809* (2013.01); *G09G 2300/0819* (2013.01); *G09G 2300/0842* (2013.01); *G09G 2300/0861* (2013.01)
(58) Field of Classification Search
 CPC ... G09G 2300/0861; G09G 2300/0842; G09G 2300/0809; G09G 3/3225; H01L 29/42316
 See application file for complete search history.

OLED PIXEL CIRCUIT, DRIVING METHOD FOR THE OLED PIXEL CIRCUIT AND DISPLAY DEVICE

CROSS-REFERENCE TO RELATED APPLICATIONS

This application claims priority to Chinese Patent Application 201711285186.X, filed Dec. 7, 2017, the entire contents of which are incorporated herein by reference.

TECHNICAL FIELD

The present disclosure relates to the display technical field, and in particular, to an Organic Light Emitting Diode (OLED) pixel circuit, a method for driving the OLED pixel circuit and a display.

BACKGROUND

OLED display is one of the hot spots in the current research field. As compared with Liquid Crystal Displays (LCDs), the OLED display has advantages such as a low energy consumption, a low production cost, self-luminescence, a wide range and a fast response speed. In the OLED display, the pixel circuit design is the core technical content, and has important research significance.

Although the OLED display has many advantages as described above, after a long period of operation of driver transistors in the OLED pixel circuit, the time for the formation of the channels and the turn-off time of the driver transistors will increase, that is, hysteresis will occur in the switching of the driver transistors during the switching of pictures. Thus, residual images may appear on the OLED display, thereby resulting in poor experiences when users look at images.

SUMMARY

Embodiments of the present disclosure provide an OLED pixel circuit, a method for driving the OLED pixel circuit, and a display device, which are capable of addressing the problem of residual images on the OLED display due to the increased time for the formation of the channels and the turn-off time of the driver transistors.

In order to achieve the above objective, embodiments of the present disclosure provide the following technical solutions.

According to an aspect, there is provided an OLED pixel circuit. The OLED pixel circuit includes: a data writing and compensation circuit, a light emitting controller, a first driver, a second driver, and a light emitting device;
wherein:
the data writing and compensating circuit is connected to the first driver, a first signal terminal and a data signal terminal, and is configured to make compensation to a threshold voltage of the first driver under control of the first signal terminal;
the first driver is connected to the light emitting controller and the first voltage terminal, and is configured to drive the light emitting device under control of the first voltage terminal and the light emitting controller after the threshold voltage is compensated;
the second driver is connected to the first driver, the light emitting controller and the first voltage terminal, and is configured to drive the light emitting device under control of the first driver, the first voltage terminal and the light emitting controller;
the light emitting controller is connected to the light emitting device and a second signal terminal, and is configured to connect the first driver and the second driver to the light emitting device under control of the second signal terminal; and
the light emitting device is connected to a second voltage terminal, and is configured to emit light by joint driving of the first driver and the second driver under control of the second voltage terminal.

According to an exemplary embodiment, the first driver includes a storage capacitor and a first drive transistor;
a first terminal of the storage capacitor is connected to the data writing and compensation circuit, and a second terminal of the storage capacitor is connected to the first voltage terminal;
a gate electrode of the first driver transistor is connected to the first terminal of the storage capacitor, a first electrode of the first driver transistor is connected to the first voltage terminal, and a second electrode of the first driver transistor is connected to the light emitting controller and the data writing and compensating circuit.

According to an exemplary embodiment, the second driver includes a second driver transistor; and
a gate electrode of the second driver transistor is connected to the first terminal of the storage capacitor, a first electrode of the second driver transistor is connected to the first voltage terminal, and a second electrode of the second driver transistor is connected to the light emitting controller.

According to an exemplary embodiment, the light emitting controller includes a first transistor and a second transistor;
a gate electrode of the first transistor is connected to the second signal terminal, a first electrode of the first transistor is connected to the second electrode of the first driver transistor, and a second electrode of the first transistor is connected to the light emitting device; and
a gate electrode of the second transistor is connected to the second signal terminal, a first electrode of the second transistor is connected to the second electrode of the second driver transistor, and a second electrode of the second transistor is connected to the light emitting device.

According to an exemplary embodiment, the first transistor has an aspect ratio which is the same as that of the second transistor.

According to an exemplary embodiment, the data writing and compensation circuit includes a third transistor and a fourth transistor;
a gate electrode of the third transistor is connected to the first signal terminal, a first electrode of the third transistor is connected to the first terminal of the storage capacitor, and a second electrode of the third transistor is connected to the data signal terminal; and
a gate electrode of the fourth transistor is connected to the first signal terminal, a first electrode of the fourth transistor is connected to the first terminal of the storage capacitor, and a second electrode of the fourth transistor is connected to the second electrode of the first driver transistor.

According to an exemplary embodiment, both the third transistor and the fourth transistor have a dual gate structure.

According to an exemplary embodiment, data signal terminal is a data signal current source which is further connected to a third voltage terminal.

According to another aspect, there is provided a display device including the OLED pixel circuit as described in the first aspect.

According to a third aspect, there is provided a method for driving an Organic Light Emitting Diode (OLED) pixel circuit, including in a data writing and compensation stage of a frame, making compensation by a data writing and compensation circuit to a threshold voltage of a first driver under control of a first signal terminal; and in a light emitting stage of the frame, enabling by a light emitting controller the first driver and a second driver to be connected to a light emitting device under control of a second signal terminal, and emitting light by the light emitting device by joint driving of the first driver and the second driver under control of the second voltage terminal.

BRIEF DESCRIPTION OF THE DRAWINGS

In order to more clearly describe the technical solutions in the embodiments of the present disclosure or in the prior art, the drawings used in the description of the embodiments or the prior art will be briefly described below. Obviously, the drawings in the following description are only some embodiments of the present disclosure, and for those skilled in the art, other drawings may also be obtained based on these drawings.

REFERENCE SIGNS

10: data writing and compensation circuit;
20: light emitting controller;
30: first driver;
40: second driver;
50: light emitting device.

DETAILED DESCRIPTION

Clear and complete descriptions will be made on the technical solutions provided by embodiments of the present disclosure with reference to drawings as mentioned in embodiments of the present disclosure. Apparently, the described embodiments are merely some but not all of the embodiments of the present disclosure. All other embodiments obtained by a person of ordinary skill in the art based on the embodiments of the present disclosure shall fall within the protection scope of the present disclosure.

Figure 1:
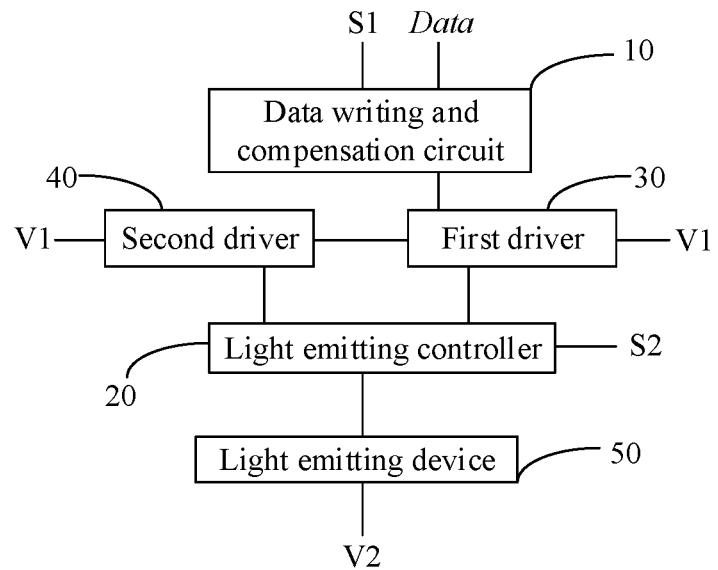
FIG. 1 is a schematic diagram showing a structure of an OLED pixel circuit according to an embodiment of the present disclosure.

An embodiment of the present disclosure provides an OLED pixel circuit. As shown in FIG. 1, the OLED pixel circuit includes a data writing and compensation circuit 10, a light emitting controller 20, a first driver 30, a second driver 40, and a light emitting device 50.

Specifically, the data writing and compensating circuit 10 is connected to the first driver 30, a first signal terminal S1 and a data signal terminal Data, and is configured to make compensation to a threshold voltage of the first driver 30 under control of the first signal terminal S1.

The first driver 30 is connected to the light emitting controller and the first voltage terminal V1, and is configured to drive the light emitting device 50 under control of the first voltage terminal V1 and the light emitting controller 20 after the threshold voltage is compensated.

The second driver 40 is connected to the first driver 30, the light emitting controller 20 and the first voltage terminal V1, and is configured to drive the light emitting device 50 under control of the first driver 30, the first voltage terminal V1 and the light emitting controller 20.

The light emitting controller 20 is connected to the light emitting device 20 and a second signal terminal S2, and is configured to connect the first driver 30 and the second driver 40 to the light emitting device 50 under control of the second signal terminal S2.

The light emitting device 50 is connected to a second voltage terminal V2, and is configured to emit light by joint driving of the first driver 30 and the second driver 40 under control of the second voltage terminal V2.

The embodiment of the present disclosure provides an OLED pixel circuit, which uses the first driver 30 and the second driver 40 to jointly drive the light emitting device 50 to emit light, so that after the data signal terminal Data is input with signals, the driving current for driving the light emitting device 50 to emit light is doubled. As compared with the prior art in which a single driver module is used, when the driving current input to the light emitting device 50 is the same, the signal input to the data signal terminal Data of the OLED pixel circuit provided by the present disclosure is half of that of the prior art, which can increase the charging speed and achieve fast compensation under a high pixel density.

In addition, under the same gray scale brightness, the negative bias voltages of the first driver 30 and the second driver 40 in the OLED pixel circuit provided in the present disclosure is lower than that of the driver module in the driving structure of the prior art. Only a small number of carriers are required to form the desired channel depth, thereby reducing the time for the formation and turn-off of the channel, reducing the hysteresis, suppressing the residual images, and improving yield and reliability. Moreover, since the negative bias voltage of the driver module is relatively small, the possibility of a threshold voltage drift is small, and the occurrence of residual images can be further avoided.

Figure 2:
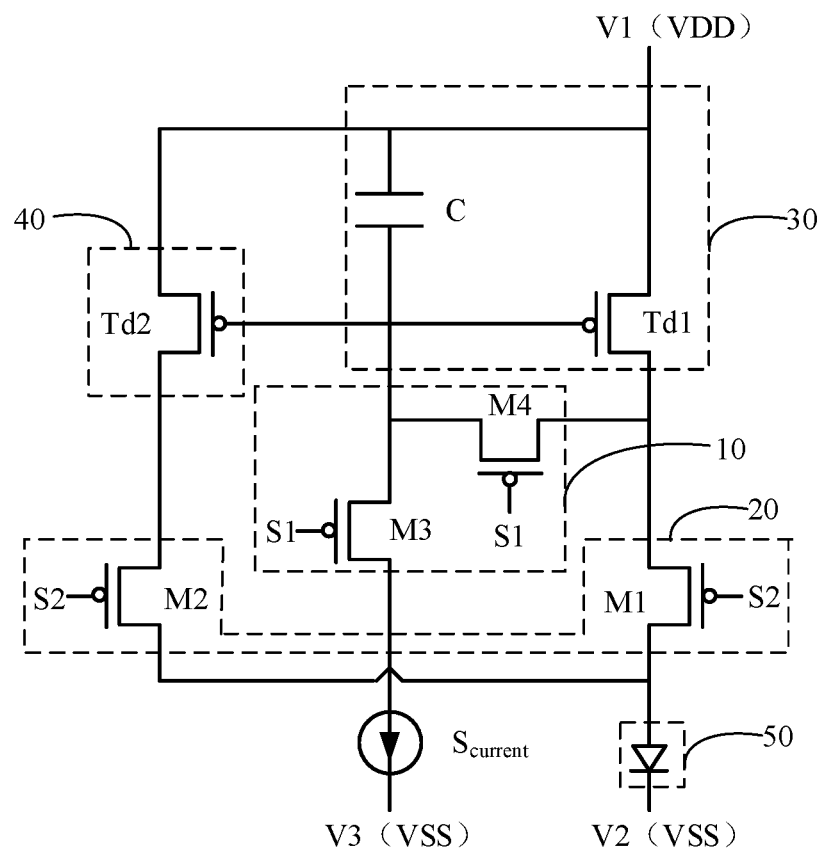
FIG. 2 is a schematic diagram showing a specific structure of individual modules in the OLED pixel circuit as shown in FIG. 1.

Specifically, as shown in FIG. 2, the first driver 30 includes a storage capacitor C and a first driver transistor Td1.

A first terminal of the storage capacitor C is connected to the data writing and compensation circuit 10, and a second terminal of the storage capacitor C is connected to the first voltage terminal V1.

A gate electrode of the first driver transistor Td1 is connected to the first terminal of the storage capacitor C, a first electrode of the first driver transistor Td1 is connected to the first voltage terminal V1, and a second electrode of the first driver transistor Td1 is connected to the light emitting controller 20 and the data writing and compensating circuit 10.

It should be noted that the first driver 30 may further include a plurality of first driver transistors Td1 connected in parallel. An example of the first driver 30 is described above, and other structures which have the same function as that of the structure as shown in FIG. 2 are not described in detail, but these structures all fall within the scope of the present disclosure.

As shown in FIG. 2, the second driver 40 includes a second driver transistor Td2.

A gate electrode of the second driver transistor Td2 is connected to the first terminal of the storage capacitor, a first electrode of the second driver transistor Td2 is connected to the first voltage terminal V1, and a second electrode of the second driver transistor Td2 is connected to the light emitting controller 20.

It should be noted that the second driver 40 may further include a plurality of second driver transistors Td2 connected in parallel. An example of the second driver 40 is described above, and other structures which have the same function as that of the structure as shown in FIG. 2 are not described in detail, but these structures all fall within the scope of the present disclosure.

In the driving process, the storage capacitor C in the first driver 30 is used not only for controlling the first driver transistor Td1 but also for controlling the second driver transistor Td2.

As shown in FIG. 2, the light emitting controller 20 includes a first transistor M1 and a second transistor M2.

A gate electrode of the first transistor M1 is connected to the second signal terminal S2, a first electrode of the first transistor M1 is connected to the second electrode of the first driver transistor Td1, and a second electrode of the first transistor M1 is connected to the light emitting device 50.

A gate electrode of the second transistor M2 is connected to the second signal terminal S2, a first electrode of the second transistor M2 is connected to the second electrode of the second driver transistor Td2, and a second electrode of the second transistor M2 is connected to the light emitting device 50.

It should be noted that the light emitting controller 20 may further include a plurality of switching transistors connected in parallel with the first transistor M1 and/or a plurality of switching transistors connected in parallel with the second transistor M2. An example of the light emitting controller 20 is described above, and other structures which have the same function as that of the structure as shown in FIG. 2 are not described in detail, but these structures all fall within the scope of the present disclosure.

According to an exemplary embodiment, in order to avoid the difference of the threshold voltages due to the difference in aspect ratios between the first transistor M1 and the second transistor M2, the aspect ratios of the first transistor M1 and the second transistor M2 are equal.

As shown in FIG. 2, the data writing and compensation circuit 10 includes a third transistor M3 and a fourth transistor M4.

A gate electrode of the third transistor M3 is connected to the first signal terminal, a first electrode of the third transistor M3 is connected to the first terminal of the storage capacitor C, and a second electrode of the third transistor M3 is connected to the data signal terminal Data.

A gate electrode of the fourth transistor M4 is connected to the first signal terminal S1, a first electrode of the fourth transistor M4 is connected to the first terminal of the storage capacitor C, and a second electrode of the fourth transistor M4 is connected to the second electrode of the first driver transistor Td1.

It should be noted that the data writing and compensation circuit 10 may further include a plurality of switching transistors connected in parallel with the third transistor M3 and/or a plurality of switching transistors connected in parallel with the fourth transistor M4. An example of the data writing and compensation circuit 10 is described above, and other structures which have the same function as that of the structure as shown in FIG. 2 are not described in detail, but these structures all fall within the scope of the present disclosure.

A gate scan signal may be input to the first signal terminal S1, for example.

According to an exemplary embodiment, in order to reduce the leakage of the transistors and to keep the performance of the transistors and the charging effect of the transistors for long time, both the third transistor M3 and the fourth transistor M4 have a dual gate structure.

As shown in FIG. 2, an anode of the light emitting device 50 is connected to the second electrode of the first transistor M1, and a cathode of the light emitting device 50 is connected to the second voltage terminal V2.

It should be noted that, firstly, the data signal terminal Data may be a data signal voltage terminal for providing a data voltage for the third transistor M3, and may also be a data signal current source $S_{current}$ for providing data current for the third transistor M3. One terminal of the data signal current source $S_{current}$ is connected to the second electrode of the third transistor M3, and the other terminal of data signal current source $S_{current}$ is connected to a third voltage terminal V3 to form a loop. When the second electrode of the third transistor M3 is connected to a high voltage, the third voltage terminal V3 is a low voltage terminal or grounded. When the second electrode of the third transistor M3 is connected to a low voltage, the third voltage terminal V3 is a high voltage terminal.

Secondly, the embodiments of the present disclosure do not limit the types of transistors in each module and unit, that is to say, the above-mentioned first driver transistor Td1, the second driver transistor Td2, the first transistor M1, the second transistor M2, the third transistor M3 and the fourth transistor M4 may be N-type transistors or P-type transistors.

The first electrode of each of the above transistors may be a drain electrode and the second electrode each of the above transistors may be a source electrode. Alternatively, the first electrode of each of the above transistors may be a source electrode and the second electrode each of the above transistors may be a drain electrode. Embodiments of the present disclosure do not impose specific limitations on this.

In addition, transistors in the pixel circuits described above may be classified into enhancement transistors and depletion transistors depending on the manner in which the transistors are conducted. Embodiments of the present disclosure do not impose specific limitations on this.

In the example of the OLED pixel circuit, transistors are all P-type transistors, a high level VDD is input to the first voltage terminal V1, a low level VSS is input to the second voltage terminal V2 and the third voltage terminal V3 or the two terminals are grounded, and both of the terminals can be connected on the same voltage terminal.

Figure 3:
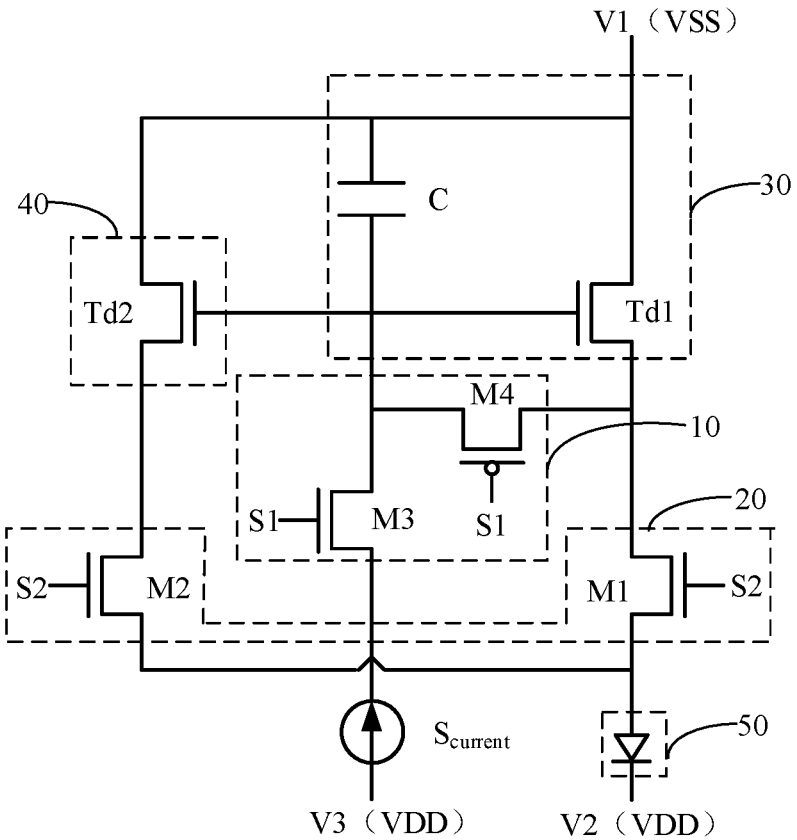
FIG. 3 is a schematic diagram showing another specific structure of individual modules in the OLED pixel circuit as shown in FIG. 1.

As shown in FIG. 3, when the transistors in the OLED pixel circuit are all N-type transistors, the low level VSS is input to the first voltage terminal V1 or the first voltage terminal V1 is grounded, and the high level VDD is input to the second voltage terminal V2 and the third voltage terminal V3, and both of the terminals can be connected on the same voltage terminal.

In the OLED pixel circuit provided by embodiments of the present disclosure, the threshold voltage and the I-R Drop (voltage drop) of the power supply are compensated by current compensation, and the data current is amplified to reduce the working bias voltages of the first drive transistor Td1 and the second drive transistor Td2 at the same grayscale luminance. Thus, the hysteresis is alleviated, and the residual images caused by long-term operation under high bias voltage can be suppressed.

Based on the above descriptions of the specific circuits of each module, the specific driving process of the above OLED pixel driving circuit will be described below in detail with reference to FIGS. 2 and 4.

It should be noted that in the following embodiments of the present disclosure, for example, transistors are P-type transistors, the first voltage terminal V1 is input with high level, and the second voltage terminal V2 and the third voltage terminal V3 are input with low level or are grounded. Here, the terms "high" and "low" here merely indicate the relative relationship between the input voltages.

Figure 4:
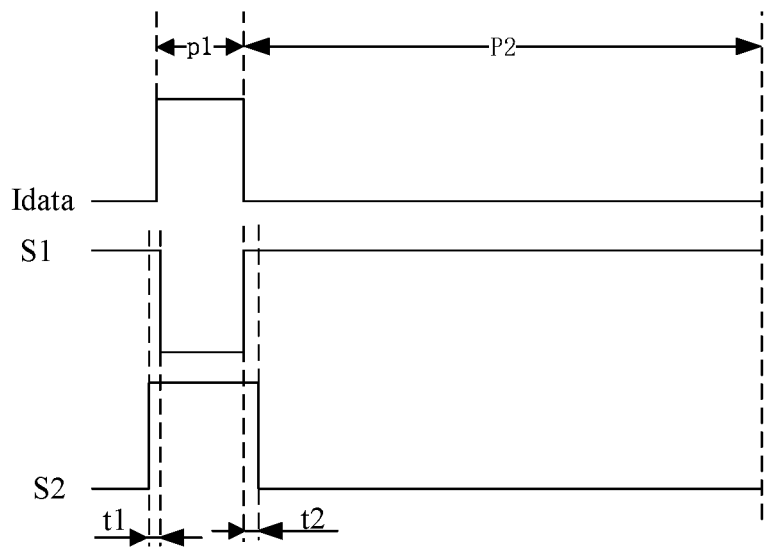
FIG. 4 is a diagram showing timing of signals used for driving the OLED pixel circuit as shown in FIG. 2.

As shown in FIG. 4, the display process of each frame of the OLED pixel circuit can be divided into a data writing and compensation stage P1 and a light emitting stage P2.

Figure 5:
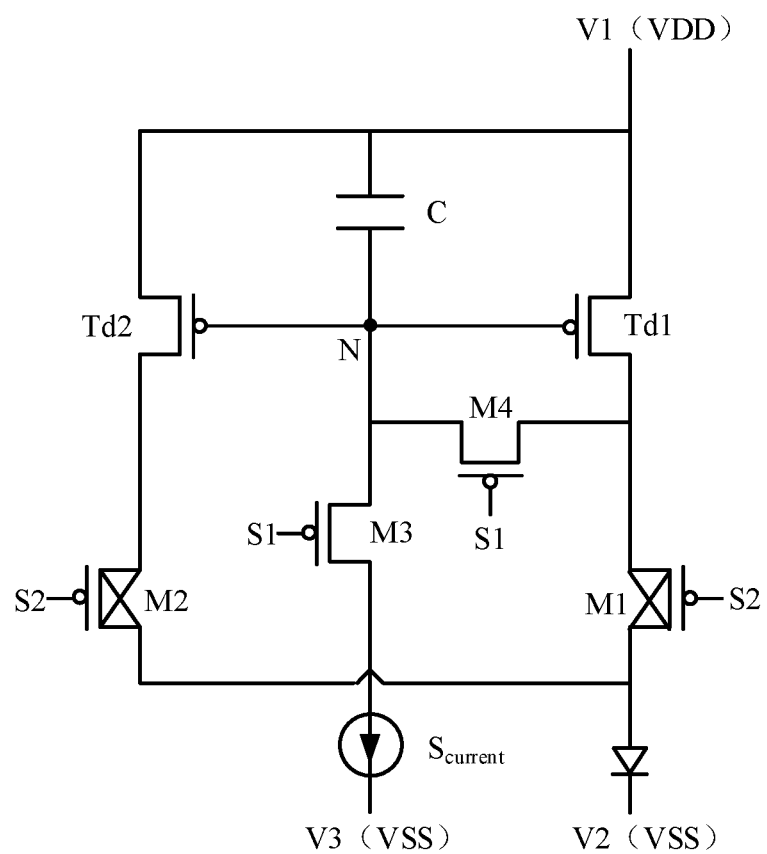
FIGS. 5 and 6 are diagrams showing equivalent circuits when the OLED pixel circuit as shown in FIG. 2 correspond to different situations.

In the data writing and compensation stage P1, a low level on signal is input to the first signal terminal S1, and a high level off signal is input to the second signal terminal S2. Accordingly, an equivalent circuit diagram of the OLED pixel circuit in FIG. 2 is shown in FIG. 5. The third transistor M3, the fourth transistor M4, the first driver transistor Td1, and the second driver transistor Td2 are all turned on, and the first transistor M1 and the second transistor M2 are both turned off (the transistor in the off state is represented by "x").

The third transistor M3 is turned on under control of the first signal terminal S1, and is connected to the data signal current source $S_{current}$ to reset the fourth transistor M4, and at the same time, the first driver 30 is compensated. The third transistor M3 is turned on, the data current Idata of the data signal current source $S_{current}$ is written to the first terminal of the storage capacitor C, and the voltage at the first terminal of the storage capacitor C is changed. The driving current can be expressed as:

$$I = \frac{W}{2L}\mu C_{ox}(V_{gs} - V_{th})^2,$$

where $$\frac{W}{L}$$

is the aspect ratio of the first driver transistor Td1, $C_{ox}$ is gate capacitance, μ is the mobility of the channel carrier, $V_{gs}$ is the gate-source voltage of the first driver transistor Td1, and $V_{th}$ is the threshold voltage of the first driver transistor Td1.

The gate-source voltage of the first driver transistor Td1 is $V_{gs}=V_g-VDD$. As can be seen from $$I_{data} = \frac{W}{2L}\mu C_{ox}(V_g - VDD - V_{th})^2,$$

the critical condition for stability is that the saturation current I of the first driver transistor Td1 is equal to the external data current Idata. When the compensation is completed, the data current is written into the storage capacitor C, the voltage at the first terminal (i.e., the node N) of the storage capacitor C is $$V_g = VDD + V_{th} - \sqrt{\frac{2LI_{data}}{W\mu C_{ox}}}.$$

Figure 6:
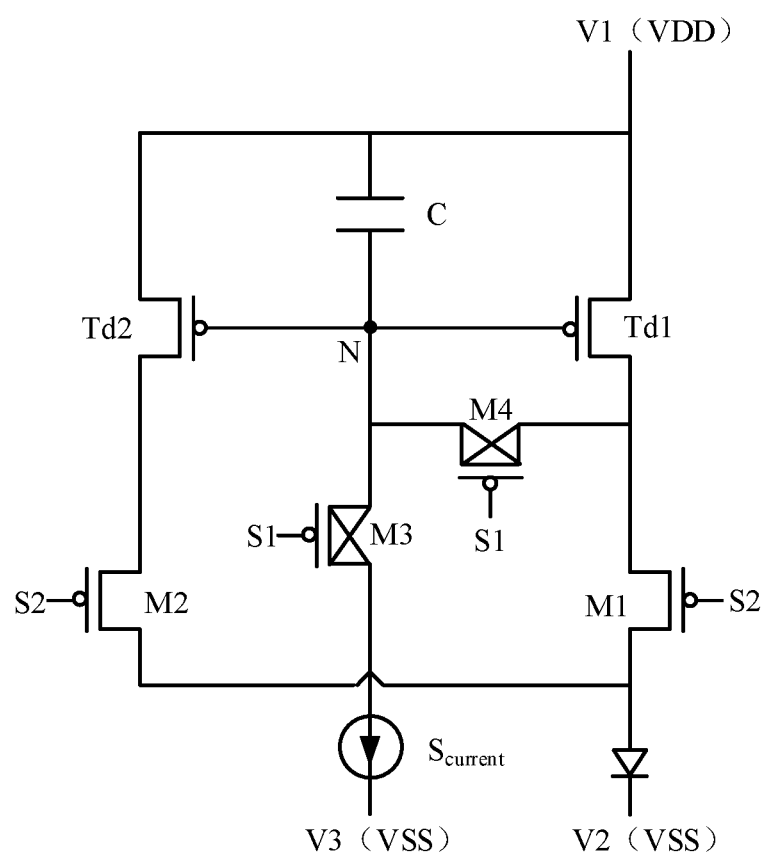

In the light emitting stage P2, a low level on signal is input to the second signal terminal S2, and a high level off signal is input to the first signal terminal S1. Accordingly, an equivalent circuit diagram of the OLED pixel circuit in FIG. 2 is shown in FIG. 6. The first transistor M1, the second transistor M2, the first driver transistor Td1, and the second driver transistor Td2 are all turned on, and the third transistor M3 and the fourth transistor M4 are all turned off.

Under control of the first transistor M1 and the second transistor M2, the first driver transistor Td1 and the second driver transistor Td2 are connected with the light emitting device 50. The light emitting device 50, under control of the second voltage terminal V2, emits light by joint driving of the first driver transistor Td1 and the second driver transistor Td2. By the joint action of the first driver transistor Td1 and the second driver transistor Td2, the externally applied data current Idata is amplified by two times. The driving current generated by the first and second driver transistors Td1 and Td2 is $$I_{data} = 2 \times \frac{W}{2L}\mu C_{ox}\left(VDD + V_{th} - \sqrt{\frac{2LI_{data}}{W\mu C_{ox}}} - VDD - V_{th}\right)^2 = 2I_{data}.$$

The doubled data current 2Idata drives the light emitting device (e.g., OLED) to emit light, and is independent of the high level VDD at the first voltage terminal V1 and the threshold voltage $V_{th}$. If the external data current Idata is not amplified by 2 times, the voltage at the first terminal (i.e., the node N) of the storage capacitor C generated by the writing of the data current 2Idata under the same grayscale is $$V_g = VDD + V_{th} - \sqrt{\frac{4LI_{data}}{W\mu C_{ox}}},$$

and the gate-source voltage of the driver transistor is $$V_{gs} = VDD + V_{th} - \sqrt{\frac{4LI_{data}}{W\mu C_{ox}}} - VDD = V_{th} - \sqrt{\frac{4LI_{data}}{W\mu C_{ox}}}.$$

If the external data current Idata is amplified by 2 times, the voltage at the first terminal (i.e., the node N) of the storage capacitor C generated by the writing of the data current 2Idata under the same grayscale is $$V_g = VDD + V_{th} - \sqrt{\frac{2LI_{data}}{W\mu C_{ox}}},$$

the gate-source voltage of each of the the first and second driver transistors Td1 and Td2 is $$V_{gs} = VDD + V_{th} - \sqrt{\frac{2LI_{data}}{W\mu C_{ox}}} - VDD = V_{th} - \sqrt{\frac{2LI_{data}}{W\mu C_{ox}}}.$$

By comparing the two situations, under the same grayscale, the driver transistors in the OLED pixel circuit in which the external data current Idata is not amplified by two times (i.e., the driver transistors in prior arts) work under a bigger negative bias voltage $$\Delta V_{gs} = \sqrt{\frac{2LI_{data}}{W\mu C_{ox}}} - \sqrt{\frac{4LI_{data}}{W\mu C_{ox}}},$$

and such bigger negative bias voltage can make threshold voltage $V_{th}$ drift easier, thereby resulting in residual images. On the contrary, the OLED pixel circuit (i.e., the technical solution provided by the present disclosure) in which the external data current Idata is amplified by two times, the possibility of the threshold voltage $V_{th}$ drift may be reduced.

The OLED pixel circuit provided by embodiments of the present disclosure can be automatically reset. When the voltage at the first terminal (i.e., the node N) of the storage capacitor C is higher than the gate voltage of the first driver transistor Td1 required for the given data current Idata of the data signal current source $S_{current}$, the data signal current source Idata will extract the charge at the first terminal of the storage capacitor C, so that the voltage at the first terminal of the storage capacitor C is reduced until the first drive transistor Td1 can generate a current equal to the data current Idata. When the voltage at the first terminal of the storage capacitor C is lower than the gate voltage of the first driver transistor Td1 required for the given data current Idata of the data signal current source $S_{current}$, the current generated by the first driver transistor Td1 will be greater than the data current Idata, and a part of the generated current is used as the driving current, and the other part of the generated current charges the first terminal of the storage capacitor C until the voltage at the first terminal of the storage capacitor C satisfies that the current generated by the first drive transistor Td1 is equal to the data current Idata.

Figure 7:
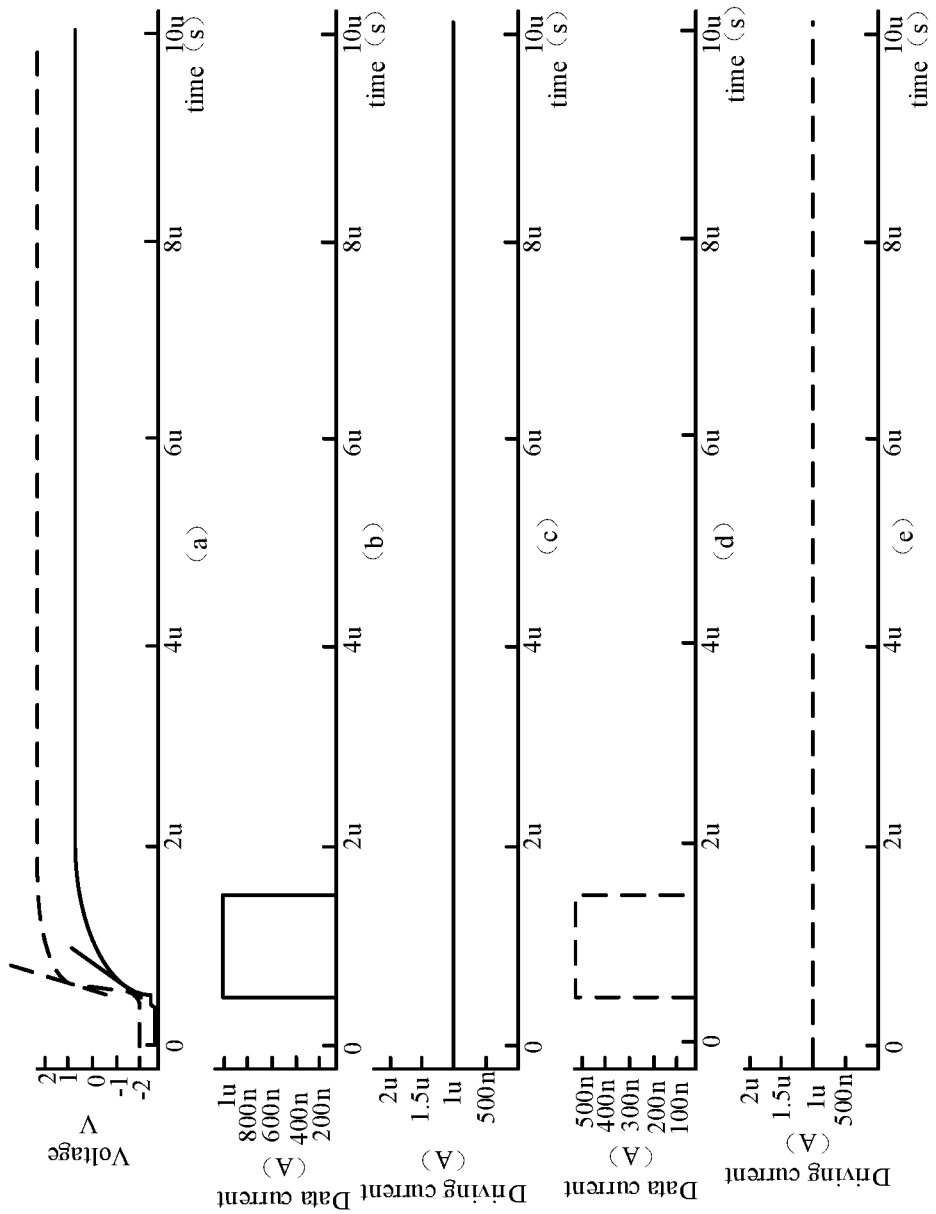
FIGS. 7 and 8 are diagrams showing simulated effects of an OLED pixel circuit according to an embodiment of the present disclosure.

FIG. 7 shows simulation results of the pixel circuit (the circuit includes two driver modules, and the simulation result of this pixel circuit is shown by dotted line in FIG. 7) in which the data current Idata is amplified and the pixel circuit (the circuit includes one driver module, and the simulation result of this pixel circuit is shown by solid line in FIG. 7) in which the data current Idata is not amplified. As can be seen from (a) in FIG. 7, the voltage at the first terminal (i.e., node N) of the storage capacitor C in the circuit which includes a single driver module is lower than the voltage at the first terminal (i.e., node N) of the storage capacitor C in the circuit which includes two driver modules. That is, when the light emitting device is driven by a single driver module, the driving transistor works under a bigger negative bias voltage. Under the same grayscale luminance, when the resulting driving current is the same (as shown in (c) and (e) of FIG. 7), the external data current Idata generated by the two driver transistors is lower than the external data generated by the single drive transistor by ½ (as shown in (b) and (d) of FIG. 7). At the same time, as can be seen from the charging slope of the first terminal (i.e., node N) of the storage capacitor C, when two driver transistors are used to drive the light emitting device, only a smaller gate voltage change is needed to increase the charging speed, and a fast compensation under a high pixel density can be achieved.

Figure 8:
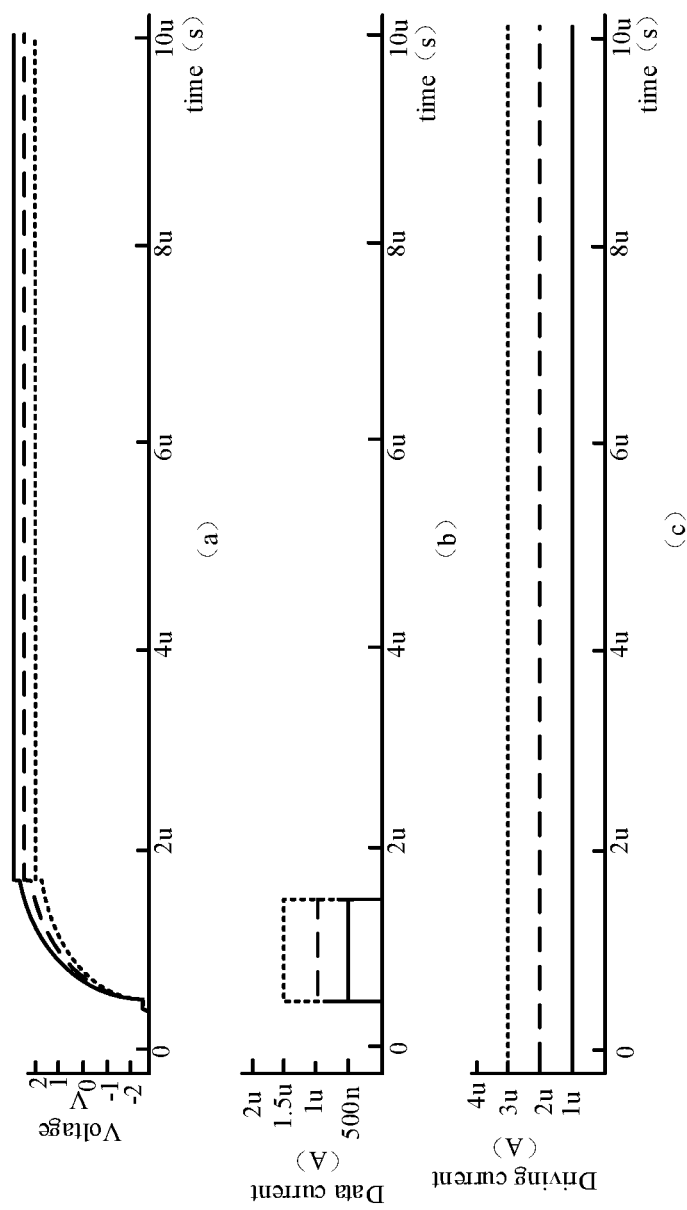

FIG. 8 shows simulation results under different data currents Idata. As shown in (b) of FIG. 8, when the external data current Idata is 0.5 uA, 1 uA, and 1.5 uA, the driving current shown in (c) of FIG. 8 is twice of the data current Idata. The voltage at the first terminal (i.e., node N) of the storage capacitor C is as shown in (a) of FIG. 8.

Further, according to an exemplary embodiment, as shown in FIG. 4, in the driving process, in order to avoid the situation in which the first driver transistor Td1, the second driver transistor Td2, the first transistor M1, and the second transistor M2 are turned on at the same time, there is a time difference t between the signal transition of the first signal terminal S1 and the second signal terminal S2. That is, a high level off signal is input to the second signal terminal S2, and after the interval time t1, a low level on signal is input to the first signal terminal S1. Similarly, a high level off signal is input to the first signal terminal S1, and after the interval time t2, a low level on signal is input to the second signal terminal S2. The time intervals t1 and t2 can be equal to each other.

In the OLED pixel circuit provided by embodiments of the present disclosure, all the functions of the existing pixel compensation circuit can be realized by adopting a current compensation technique that amplifies the data current Idata, the driver transistors work under a smaller bias stress, less carriers are needed to form the required channel depth so as to reduce the time for the channel formation and cut-off time; also, the OLED pixel circuit can reduce the probability that carriers are trapped by the gate insulation layer under large bias voltage, the hysteresis is alleviated; also, the OLED pixel circuit can reduce threshold voltage $V_{th}$ drift, residual images are suppressed, and thus product yield and reliability are improved.

The OLED pixel circuit provided by embodiments of the present disclosure can achieve the compensation of the threshold voltage, the compensation of the power supply voltage drop, and suppressing the residual images, effectively stabilize the driving current of the light emitting device and improve the light emission of the light emitting device. In addition, only a smaller gate voltage change is required to increase the charging speed, and a fast compensation under a high pixel density can be achieved. In addition, compensation can be realized by the current driving without a reset, and thus this can reduce the amount of arrangements such as wires and increase the internal wiring space margin.

An embodiment of the present disclosure provides a display device which includes the OLED pixel circuits as described above.

An embodiment of the present disclosure provides a display device including the OLED pixel circuit according to any one of the embodiments as described. The display device may include an array of a plurality of pixel units. Each of the pixel unit includes the OLED pixel circuit according to any one of the embodiments as described. The display device provided by embodiments of the present disclosure may have the same advantageous effects as that of the OLED pixel circuit provided by embodiments of the present disclosure. As for the advantageous effects of the OLED pixel circuit, detailed descriptions have been made above, and repeated descriptions are omitted here.

Figure 9:
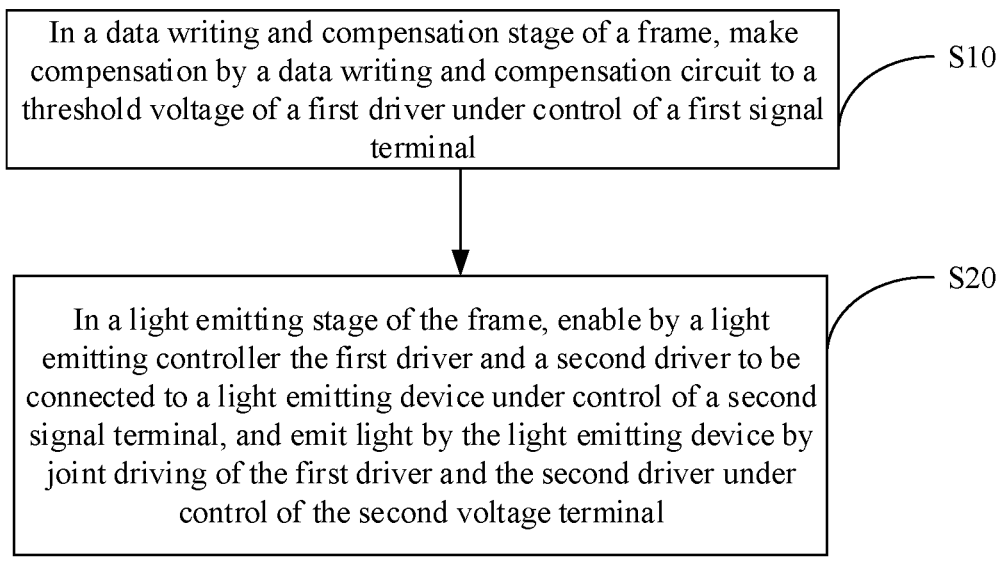
FIG. 9 is a flow chart showing a method for driving an OLED pixel circuit according to an embodiment of the present disclosure.

An embodiment of the present disclosure provides a method for driving an OLED pixel circuit. As shown in FIG. 9, the method includes the following steps.

In S10, in a data writing and compensation stage of a frame, the data writing and compensation circuit 10 makes compensation to the threshold voltage of the first driver 30 under control of the first signal terminal S1.

In S20, in a light emitting stage of the frame, the light emitting controller 20 enables the first driver 30 and the second driver 40 to be connected to the light emitting device 50 under control of the second signal terminal S2, and the light emitting device emits light by joint driving of the first driver 30 and the second driver 40 under control of the second voltage terminal V2.

In the method driving an OLED pixel circuit provided by embodiments of the present disclosure, reset, compensation (compensation to the threshold voltage and the power supply drop) and light emission can be realized in two stages, thereby increasing the processing speed.

The exemplary implementations of the present disclosure are provided above, and however, the present disclosure is not limited to the implementations set forth herein. One of ordinary skill in this art can devise many changes or alternatives based on the technical contents provided in the present disclosure, and such changes or alternatives should be included in the scope of the present disclosure. Thus, the scope of the present disclosure is defined by the appended claims.

What is claimed is:

1. An Organic Light Emitting Diode (OLED) pixel circuit, comprising: a data writing and compensation circuit, a light emitting controller, a first driver, a second driver, and a light emitting device;
wherein:
the data writing and compensating circuit is connected to the first driver, a first signal terminal and a data signal terminal, the data writing and compensating circuit is configured to make compensation to a threshold voltage of the first driver under control of the first signal terminal;
the first driver is connected to the light emitting controller and a first voltage terminal, the first driver is configured to drive the light emitting device under control of the first voltage terminal and the light emitting controller after the threshold voltage is compensated;
the second driver is connected to the first driver, the light emitting controller and the first voltage terminal, the second driver is configured to drive the light emitting device under control of the first driver, the first voltage terminal and the light emitting controller;
the light emitting controller is connected to the light emitting device and a second signal terminal, and the light emitting controller is configured to connect the first driver and the second driver to the light emitting device under control of the second signal terminal; and
the light emitting device is connected to a second voltage terminal, and the light emitting device is configured to emit light by joint driving of the first driver and the second driver under control of the second voltage terminal,
the first driver comprises a storage capacitor and a first drive transistor;
a first terminal of the storage capacitor is connected to the data writing and compensation circuit, and a second terminal of the storage capacitor is connected to the first voltage terminal;
a gate electrode of the first driver transistor is connected to the first terminal of the storage capacitor, a first electrode of the first driver transistor is connected to the first voltage terminal, and a second electrode of the first driver transistor is connected to the light emitting controller and the data writing and compensating circuit,
the second driver comprises a second driver transistor; and
a gate electrode of the second driver transistor is connected to the first terminal of the storage capacitor, a first electrode of the second driver transistor is connected to the first voltage terminal, and a second electrode of the second driver transistor is connected to the light emitting controller.

2. The OLED pixel circuit of claim 1, wherein:
the light emitting controller comprises a first transistor and a second transistor;
a gate electrode of the first transistor is connected to the second signal terminal, a first electrode of the first transistor is connected to the second electrode of the first driver transistor, and a second electrode of the first transistor is connected to the light emitting device; and
a gate electrode of the second transistor is connected to the second signal terminal, a first electrode of the second transistor is connected to the second electrode of the second driver transistor, and a second electrode of the second transistor is connected to the light emitting device.

3. The OLED pixel circuit of claim 2, wherein the first transistor has an aspect ratio which is the same as that of the second transistor.

4. The OLED pixel circuit of claim 1, wherein:
the data writing and compensation circuit comprises a third transistor and a fourth transistor;
a gate electrode of the third transistor is connected to the first signal terminal, a first electrode of the third transistor is connected to the first terminal of the storage capacitor, and a second electrode of the third transistor is connected to the data signal terminal; and
a gate electrode of the fourth transistor is connected to the first signal terminal, a first electrode of the fourth transistor is connected to the first terminal of the storage capacitor, and a second electrode of the fourth transistor is connected to the second electrode of the first driver transistor.

5. The OLED pixel circuit of claim 4, wherein both the third transistor and the fourth transistor have a dual gate structure.

6. The OLED pixel circuit of claim 1, wherein the data signal terminal is a data signal current source which is further connected to a third voltage terminal.

7. A display device comprising an Organic Light Emitting Diode (OLED) pixel circuit comprising: a data writing and compensation circuit, a light emitting controller, a first driver, a second driver, and a light emitting device;
wherein:
the data writing and compensating circuit is connected to the first driver, a first signal terminal and a data signal terminal, the data writing and compensating circuit is configured to make compensation to a threshold voltage of the first driver under control of the first signal terminal;
the first driver is connected to the light emitting controller and a first voltage terminal, the first driver is configured to drive the light emitting device under control of the first voltage terminal and the light emitting controller after the threshold voltage is compensated;

the second driver is connected to the first driver, the light emitting controller and the first voltage terminal, the second driver is configured to drive the light emitting device under control of the first driver, the first voltage terminal and the light emitting controller;

the light emitting controller is connected to the light emitting device and a second signal terminal, the light emitting controller is configured to connect the first driver and the second driver to the light emitting device under control of the second signal terminal; and the light emitting device is connected to a second voltage terminal, the light emitting device is configured to emit light by joint driving of the first driver and the second driver under control of the second voltage terminal, the first driver comprises a storage capacitor and a first drive transistor;

a first terminal of the storage capacitor is connected to the data writing and compensation circuit, and a second terminal of the storage capacitor is connected to the first voltage terminal;

a gate electrode of the first driver transistor is connected to the first terminal of the storage capacitor, a first electrode of the first driver transistor is connected to the first voltage terminal, and a second electrode of the first driver transistor is connected to the light emitting controller and the data writing and compensating circuit, the second driver comprises a second driver transistor; and a gate electrode of the second driver transistor is connected to the first terminal of the storage capacitor, a first electrode of the second driver transistor is connected to the first voltage terminal, and a second electrode of the second driver transistor is connected to the light emitting controller.

8. The display device of 7, wherein:

the light emitting controller comprises a first transistor and a second transistor;

a gate electrode of the first transistor is connected to the second signal terminal, a first electrode of the first transistor is connected to the second electrode of the first driver transistor, and a second electrode of the first transistor is connected to the light emitting device; and a gate electrode of the second transistor is connected to the second signal terminal, a first electrode of the second transistor is connected to the second electrode of the second driver transistor, and a second electrode of the second transistor is connected to the light emitting device.

9. The display device of claim 8, wherein the first transistor has an aspect ratio which is the same as that of the second transistor.

10. The display device of claim 7, wherein:

the data writing and compensation circuit comprises a third transistor and a fourth transistor;

a gate electrode of the third transistor is connected to the first signal terminal, a first electrode of the third transistor is connected to the first terminal of the storage capacitor, and a second electrode of the third transistor is connected to the data signal terminal; and a gate electrode of the fourth transistor is connected to the first signal terminal, a first electrode of the fourth transistor is connected to the first terminal of the storage capacitor, and a second electrode of the fourth transistor is connected to the second electrode of the first driver transistor.

11. The display device of claim 10, wherein both the third transistor and the fourth transistor have a dual gate structure.

12. The display device of claim 7, wherein the data signal terminal is a data signal current source which is further connected to a third voltage terminal.

13. A method for driving an Organic Light Emitting Diode (OLED) pixel circuit, comprising:

in a data writing and compensation stage of a frame, making compensation by a data writing and compensation circuit to a threshold voltage of a first driver under control of a first signal terminal; and in a light emitting stage of the frame, enabling by a light emitting controller the first driver and a second driver to be connected to a light emitting device under control of a second signal terminal, and emitting light by the light emitting device by joint driving of the first driver and the second driver under control of the second voltage terminal,. the first driver comprises a storage capacitor and a first drive transistor;

a first terminal of the storage capacitor is connected to the data writing and compensation circuit, and a second terminal of the storage capacitor is connected to the first voltage terminal;

a gate electrode of the first driver transistor is connected to the first terminal of the storage capacitor, a first electrode of the first driver transistor is connected to the first voltage terminal, and a second electrode of the first driver transistor is connected to the light emitting controller and the data writing and compensating circuit, the second driver comprises a second driver transistor; and a gate electrode of the second driver transistor is connected to the first terminal of the storage capacitor, a first electrode of the second driver transistor is connected to the first voltage terminal, and a second electrode of the second driver transistor is connected to the light emitting controller.

\* \* \* \* \*